United States Patent [19]
Coy

[11] Patent Number: 5,945,863
[45] Date of Patent: Aug. 31, 1999

[54] ANALOG DELAY CIRCUIT

[75] Inventor: Bruce H. Coy, San Diego, Calif.

[73] Assignee: Applied Micro Circuits Corporation, San Diego, Calif.

[21] Appl. No.: 08/878,162

[22] Filed: Jun. 18, 1997

[51] Int. Cl.⁶ .............................. H03K 5/13; H03K 17/28
[52] U.S. Cl. ........................ 327/280; 327/287; 327/246; 327/277
[58] Field of Search ................................. 327/231, 232, 327/246, 247, 269–272, 252, 253, 266, 270, 274, 276–278, 280, 284, 285, 287

[56] References Cited

U.S. PATENT DOCUMENTS

| | | | |
|---|---|---|---|
| 4,052,679 | 10/1977 | Hosoya | 330/261 |
| 4,795,923 | 1/1989 | Dobos | 307/605 |
| 4,797,586 | 1/1989 | Traa | 307/603 |
| 4,866,314 | 9/1989 | Traa | 307/603 |
| 5,066,877 | 11/1991 | Hamano et al. | 307/603 |
| 5,086,500 | 2/1992 | Greub | 395/550 |
| 5,087,842 | 2/1992 | Pulsipher et al. | 327/271 |
| 5,138,204 | 8/1992 | Imamura et al. | 327/172 |
| 5,218,363 | 6/1993 | LeCroy, Jr. et al. | 341/123 |
| 5,327,031 | 7/1994 | Marbot et al. | 307/603 |
| 5,463,343 | 10/1995 | Marbot | 327/271 |
| 5,528,186 | 6/1996 | Imamura | 327/172 |

*Primary Examiner*—Tim Callahan
*Assistant Examiner*—Eunja Shin
*Attorney, Agent, or Firm*—Gray Cary Ware Freidenrich

[57] ABSTRACT

An analog delay circuit provide a current-dependent delay through two differential pairs of transistors operated in parallel, one with input resistors, the other without. Delay is varied through the delay stage by provision of complementary currents produced by a current DAC in response to digital code provided in a data bus. The complementary currents drive the differential pairs to various combinations of operations, which yields the desired variable delay.

11 Claims, 2 Drawing Sheets

ANALOG DELAY CIRCUIT

BACKGROUND OF THE INVENTION

The present invention relates to analog delay circuits, and particularly to analog circuits that present an adjustable, or variable, delay between input and output.

1. Field of the Invention

The introduction of a time delay $\Delta$ into a digital system has many useful applications. As pointed out by J. Millman, et al in *Microelectronics*, (McGraw-Hill, 1987) at page 328, where $\Delta$ is an integral multiple of a clock T, a shift register having n stages may be employed to delay an input pulse stream by a time $(n-1)\ T=\Delta$.

It is useful that such delay be adjustable, particularly for purposes of intersignal synchronization in logic circuits. However, if the adjustment in $\Delta$ must respond to a continuously-variable voltage, or if it must be continuous itself, some or all, of the adjustment must be implemented in analog circuitry. In this regard, reference is given to U.S. Ser. No. 08/856,259, filed May 14, 1997, now U.S. Pat. No. 5,847,621, entitled "LC OSCILLATOR WITH DELAY TUNING", in which continuously-variable delay is used for tuning the frequency of a voltage-controlled oscillator (VCO). As is known, a VCO is a necessary component of a phase-locked loop. Therefore, implementation of variable delay in a form that can be accommodated in integrated circuit technology is highly desirable, especially in the mixed analog-digital VL,SI technology that is described, for example, by Y. Tsividis in *Mixed Analog-Digital VLSI Devices And Technology*, (McGraw-Hill, 1996). As Tsividis points out at page 3, mixed analog-digital circuits "help make possible the high performance of the digital systems and circuits themselves". Tsividis at p. 3.

Therefore a general need exists for the provision of mixed analog-digital circuits that will enhance the performance of digital systems. More specifically, a need exists for a voltage-controlled, variable analog delay circuit that can be built entirely in an integrated circuit (IC) for interfacing with digital circuits.

SUMMARY OF THE INVENTION

The invention is an analog delay circuit that yields a variable delay between an input signal and an output signal, wherein two differential pairs of transistors are connected in parallel, with a first of the differential pairs having a first signal path delay, and a second of the differential pairs having a second signal path delay. In each differential pair, the respective delay may be varied by varying a current provided to operate the differential pair. The differential pairs are connected to a current source, preferably embodied as a current digital-to-analog converter ("current DAC") that outputs a pair of complementary currents. A first current of the pair of complementary currents operates the first differential pair, while the second current operates the second differential pair. The current DAC is controlled by a digital code. As the digital code varies, the magnitudes of the complementary currents vary. As a consequence, the delays through the differential pairs vary. Since they operate in parallel, the differential pairs produce a composite variable delay that combines the individual variable delays. The invention therefore yields a current-controlled delay element that may be operated alone, or cascaded with one or more identical delay elements to provide either a variable-length delay line, a current-controlled oscillator with a variable frequency.

It is therefore an object of this invention to provide an analog delay circuit that may be implemented wholly in IC technology.

It is a further object of this invention to provide such an analog delay circuit having a delay that may be varied in response to a variable current.

A further object is to provide an analog delay circuit that may be combined with identical elements to provide a delay line whose total delay may be varied in response to a variable current.

Still another object is to provide a current-controlled oscillator with a frequency controlled by a digital code.

A thorough reading of the following Detailed Description in light of the accompanying drawings will confirm the achievement of these, and other, objectives.

DETAILED DESCRIPTION OF THE PREFERRED EMBODIMENTS

Figure 1:
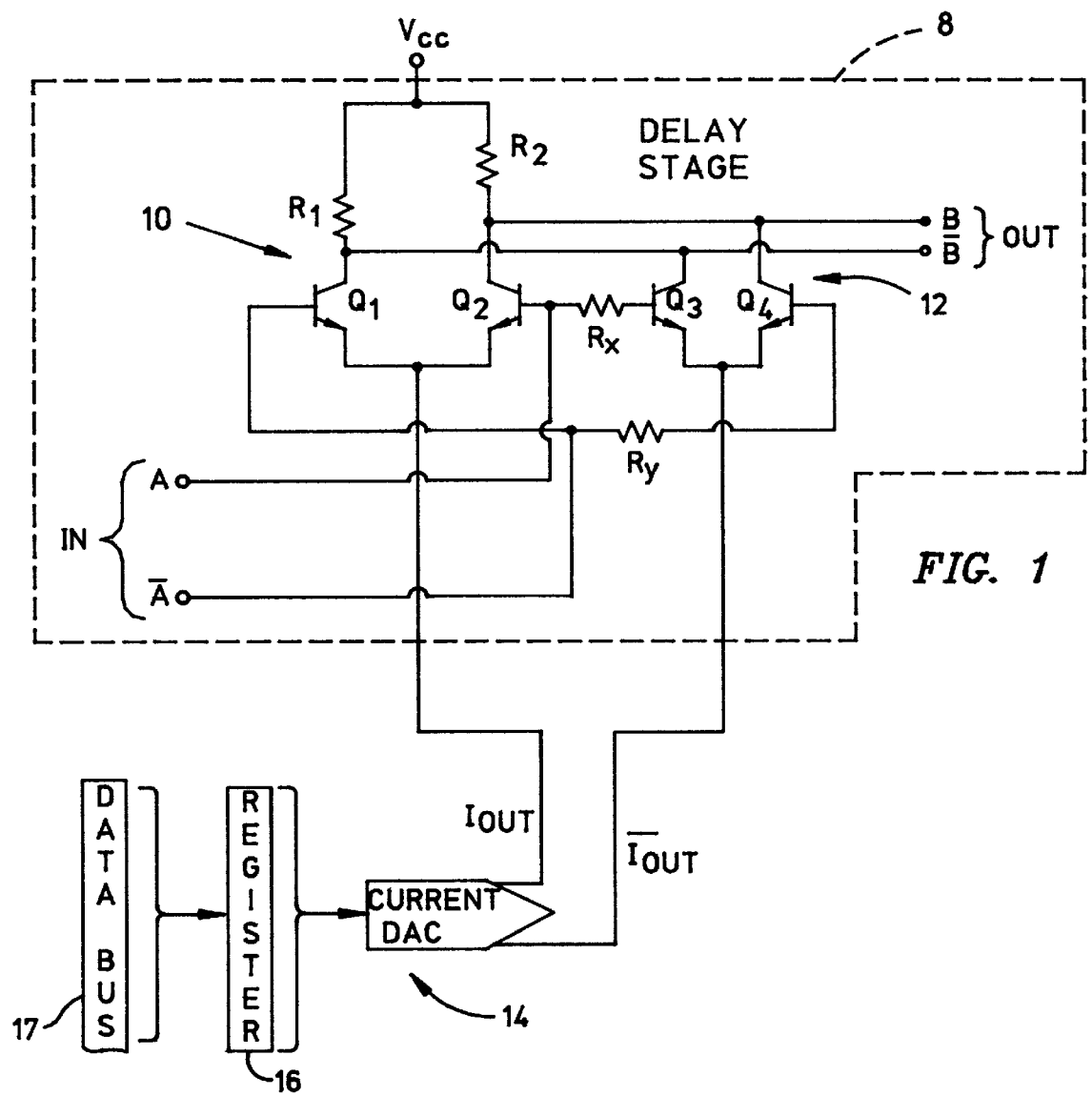
FIG. 1 is schematic diagram of an analog delay circuit according to this invention.

Referring now to the drawings and figures in which identical reference numerals refer to identical elements, FIG. 1 is a schematic diagram of an analog delay circuit according to this invention. The analog delay circuit includes an analog delay element, or delay stage, 8 in combination with a current DAC 14. The delay stage 8 includes a pair of differential transistor pairs 10 and 12. The first differential transistor pair 10 includes emitter-coupled transistors Q1 and Q2, while the second differential pair 12 includes emitter-coupled transistors Q3 and Q4. The two differential pairs are connected to matched pull-up resistors R1 and R2. Each of the pull-up resistors is connected on one side to a collector of a respective transistor in each of the differential pairs 10 and 12, and on its other side to a collector voltage Vcc. In this regard, resistor R1 is connected to the collectors of transistors Q1 and Q3 and resistor R2 is connected to the collectors of transistors Q2 and Q4. Both resistors R1 and R2 are passive pull-up resistors that bias the transistors to whose collectors they are connected.

Each differential pair 10, 12 is essentially an analog amplifier that produces an output signal (OUT) in response to an input signal (IN).

Figure 2:
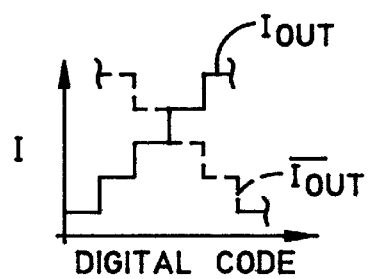
FIG. 2 is a representative plot of the complementary currents produced by a current DAC in response to an input digital code.

Each of the differential pairs 10 and 12 is connected to an output of a current DAC 14. The current DAC 14 is conventional, producing a pair of complementary output currents (Iout/$\overline{\text{Iout}}$) in response to a digital code input from a register 16. The current Iout sets the differential pair 10 to a level of operation, which may vary between off and full on. Similarly, the current $\overline{\text{Iout}}$ sets the differential pair 12 to a level of operation between off and full on. The relationship between the digital code and the pair of complementary output currents produced by the current DAC 14 is illustrated in FIG. 2. The digital code may be provided in a digital logic system by way of a data bus 17, or other appropriate means.

As will be appreciated, the differential pairs 10 and 12 are connected in parallel between Vcc and the current DAC 14.

The delay stage 8 receives the input signal (IN) comprising complementary inputs A/$\overline{\text{A}}$, and, in response, produces the output (OUT) comprising complementary signals B/$\overline{\text{B}}$. A delay time between the input and output signals is adjusted according to the composite level at which the two differential pairs 10 and 12 operate. Minimum delay (the fast case) occurs if Iout from the current DAC 14 is full scale, in which circumstance Q3 and Q4 are turned off, while Q1 and Q2 are turned completely on. In this case, the delay is essentially determined by the minimum parametric input values of the transistors Q1 and Q2. As the magnitude of Iout decreases, the response time, and therefore the delay through the differential pair 10 increases. The maximum delay (the slow case) occurs when the magnitude of Iout falls below the level required to keep Q1 and Q2 turned on; in this case, the magnitude of $\overline{\text{I}}$out turns Q3 and Q4 fully on. In the slow case, each of the matched resistors Rx and Ry forms a pole with the input capacitance of each of the transistors Q3 and Q4. This added pole in the signal path increases the delay through the differential pair 12 in comparison with that through the differential pair 10. As the magnitude of $\overline{\text{I}}$out decreases, the magnitude of Iout increases, and the composite delay through the delay stage 8 decreases. Consequently, by mixing a percentage of each of the fast and slow cases of biasing, with Iout and $\overline{\text{I}}$out at various combinations of magnitudes between their maximum and minimum values, in response to changes in the digital code applied to the DAC 14, a virtually continuous and monotonic time delay between the input and output signals through the delay stage 8 is realized.

Figure 3:
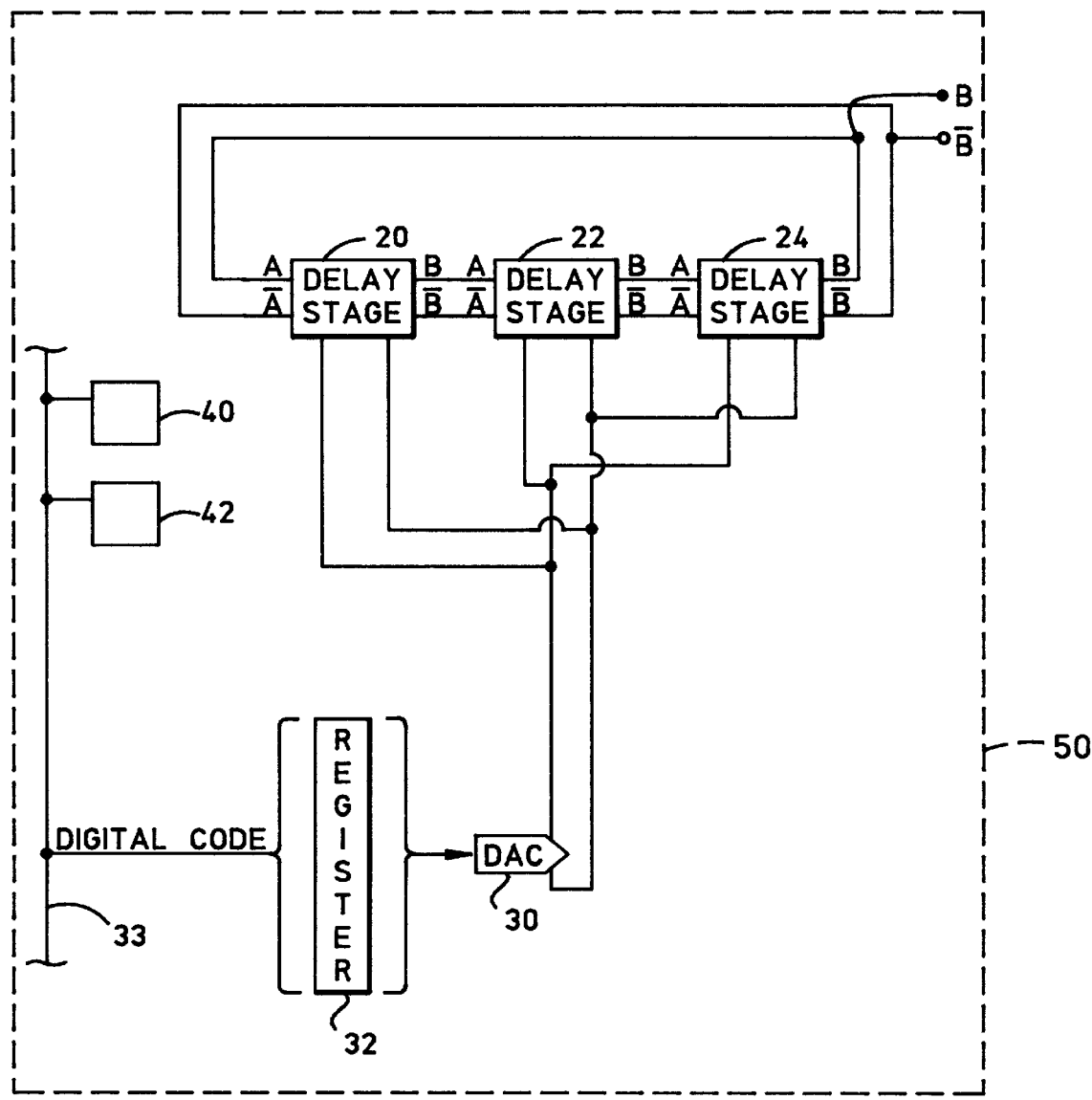
FIG. 3 is block diagram of a ring oscillator constructed by cascading multiple delay stages, each of which embodies the analog delay circuit of FIG. 1.

FIG. 3 is a block diagram illustrating a current-controlled ring oscillator comprising delay stages 20, 22, and 24, each identical to the delay stage 8 illustrated in FIG. 1. Adjustment of delay through each of the stages 20, 22 and 24 is provided by a current DAC 30 that produces complementary DAC currents in the manner illustrated in FIGS. 1 and 2. The magnitudes of the complementary currents produced by the current DAC 30 are determined by a digital code registered at 32 and delivered by the data bus 33 in response to circuit operations of a digital logic system. With feedback, the current-controlled oscillator changes frequency with change in the delay through the stages 20, 22, 24. Thus, the digital codes generate respective frequencies by oscillator delay. Without feedback of the output of the delay stage 24 to the input of the delay stage 20, and with provision of an input signal to the input of the delay stage 20, the cascade of delay stages 20, 22 and 24 becomes a delay line with variable delay between an input to, and an output of, the delay line.

As those skilled in the art of IC technology fabrication will appreciate, the structure of the analog delay circuit of FIG. 1 permits it to be wholly integrated into an integrated circuit manufactured according to known techniques. The inventor contemplates that any appropriate active semiconductor device technology, including, but not limited to, IGFET, MOSFET, BIPOLAR, GaAsFET, or other, may be used without departing from the spirit of the invention. Therefore, an analog delay circuit of the invention may be fabricated, with one or more delay stages, in an integrated circuit such as the IC 50, together with other electronic circuits, such as 40 and 42 to provide a digital logic system.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

I claim:

1. A delay circuit, comprising:
    a first differential pair of emitter-coupled transistors with a first adjustable delay;
    at least a second differential pair of emitter-coupled transistors with a second adjustable delay;
    the first and second differential pairs of emitter-coupled transistors being connected to a common input and a common output to provide a composite adjustable delay between the common input and common output that combines the first and second adjustable delays;
    a register for containing a digital code;
    a current digital-to-analog converter (DAC) connected to the register for providing a pair of complementary currents in response to the digital code, the current DAC being connected to provide a first current of the pair of complementary currents to the first differential pair and to provide a second current of the pair of complementary currents to the second differential pair; and,
    wherein the first and second differential pairs each include first and second emitter-coupled transistors, the delay circuit further including a first resistor connected to the base of a first transistor of the second differential pair and a second resistor connected to the base of a second transistor of the second differential pair.

2. The delay circuit of claim 1, further including means connected to the register for providing the digital code.

3. The delay circuit of claim 2, wherein the means includes a data bus.

4. An integrated circuit with one or more electronic circuits, in which at least one of the electronic circuits includes an analog delay circuit having:
    a first differential pair of emitter-coupled transistors with a first adjustable delay;
    at least a second differential pair of emitter-coupled transistors with a second adjustable delay;
    the first and second differential pairs of emitter-coupled transistors being connected to a common input and a common output to provide a composite adjustable delay between the common input and common output that combines the first and second adjustable delays;
    a register for containing a digital code;
    a current digital-to-analog converter (DAC) connected to the register for providing a pair of complementary currents in response to the digital code, the current DAC being connected to provide a first current of the pair of complementary currents to the first differential pair and to provide a second current of the pair of complementary currents to the second differential pair; and,
    wherein the first and second differential pairs each include first and second emitter-coupled transistors, the delay circuit further including a first resistor connected to the base of a first transistor of the second differential pair and a second resistor connected to the base of a second transistor of the second differential pair.

5. The integrated circuit of claim 4, wherein the analog delay circuit further includes means connected to the register for providing the digital code.

6. The integrated circuit of claim 5, wherein the means includes a data bus.

7. A delay circuit comprising:
    a plurality of cascaded delay stages, each delay stage including a common input and a common output, and:
        a first differential pair of emitter-coupled transistors with a first adjustable delay;
        at least a second differential pair of emitter-coupled transistors with a second adjustable delay; and the first and second differential pairs of emitter-coupled transistors being connected to the common input and the common output to provide a composite adjustable delay between the common input and common output that combines the first and second adjustable delays;

a register for containing a digital code;

a current digital-to-analog converter (DAC) connected to the register for providing a pair of complementary currents in response to the digital code, the current DAC being connected to provide a first current of the pair of complementary currents to the first differential pair of each delay stage and to provide a second current of the pair of complementary currents to the second differential pair of each delay stage; and, wherein, for said each delay stage, the first and second differential pairs each include first and second emitter-coupled transistors, said each delay stage further including a first resistor connected to the base of a first transistor of the second differential pair and a second resistor connected to the base of a second transistor of the second differential pair.

8. The delay circuit of claim 7, further including means connected to the register for providing the digital code.

9. The delay circuit of claim 8, wherein the means includes a data bus.

10. An integrated circuit with one or more electronic circuits, at least one electronic circuit including the delay circuit of claim 7.

11. The integrated circuit of claim 10, wherein the delay circuit includes semiconductor devices selected from the group including IFET, MOSFET, BIPOLAR, and GaSaFET devices.

* * * * *